United States Patent [19]

Rinderle et al.

[11] Patent Number: 4,613,823
[45] Date of Patent: Sep. 23, 1986

[54] MULTI-STAGE SIGNAL TRANSMITTING SYSTEM

[75] Inventors: Heinz Rinderle; Martin Siegle, both of Heilbronn, Fed. Rep. of Germany

[73] Assignee: Telefunken electronic GmbH, Heilbronn, Fed. Rep. of Germany

[21] Appl. No.: 637,032

[22] Filed: Aug. 2, 1984

[30] Foreign Application Priority Data

Aug. 17, 1983 [DE] Fed. Rep. of Germany ....... 3329663

[51] Int. Cl.$^4$ .......................... H03F 3/04; H03G 3/10
[52] U.S. Cl. ...................................... 330/289; 330/278
[58] Field of Search ....................... 330/256, 289, 278; 307/310

[56] References Cited

FOREIGN PATENT DOCUMENTS

| 2308835 | 9/1973 | Fed. Rep. of Germany . |
| 110726 | 1/1975 | Fed. Rep. of Germany . |
| 2620586 | 11/1977 | Fed. Rep. of Germany . |
| 2648080 | 8/1979 | Fed. Rep. of Germany . |
| 3043641 | 6/1981 | Fed. Rep. of Germany . |
| 2546844 | 9/1981 | Fed. Rep. of Germany . |
| 1389056 | 4/1975 | United Kingdom . |
| 1519069 | 7/1978 | United Kingdom . |

OTHER PUBLICATIONS

Kawashima, K., "A New Temperature Compensating Method for Logarithmic Amplifier", IEEE Trans. Nucl. Sci., vol. NS-17, No. 5, Oct. 1970.

Primary Examiner—Gene Wan
Attorney, Agent, or Firm—Spencer & Frank

[57] ABSTRACT

In a multi-stage signal transmitting system whose amplification is electronically adjustable and wherein undesired temperature influence on the amplification is compensated, the amplification adjustment is effected by a stage and the temperature variation compensation via the same stage, which is an amplifier stage, and the temperature variation compensation is independent of the amplifier setting.

9 Claims, 21 Drawing Figures

MULTI-STAGE SIGNAL TRANSMITTING SYSTEM

BACKGROUND OF THE INVENTION

Multi-stage signal transmitting systems are used, for example, in broadcasting receivers. Here, the multi-stage signal transmitting system consists, for example, of pre-amplifier, mixer, IF amplifier and LF amplifier. In such signal transmitting systems the problem occurs that the amplification in the individual stages is subject to straying effects and is also temperature-dependent. This results, for example, in undesirable changes in switching thresholds such as, for example, the switching threshold of a mono/stereo switch-over.

SUMMARY OF THE INVENTION

The object underlying the invention is to provide a multi-stage signal transmitting system enabling electronic adjustment of the amplification degree for the entire system in as simple a manner as possible and also simple temperature variation compensation. The settings are, furthermore, not to influence each other in any way. According to the invention there is provided in a multi-stage signal transmitting system a stage which effects both adjustment of the amplification and temperature compensation, with this stage being an amplifier stage and the temperature compensation being independent of the amplification setting.

In the multi-stage signal transmitting system for broadcasting receivers mentioned as an example at the outset, the first IF amplifier stage is, for example, the stage which is best suited for the control according to the invention.

According to a further development of the invention, the amplification of the controlled stage is exponentially dependent on the control signal which is fed to this stage for the amplification setting.

In accordance with another further development of the invention, the control signal for the amplification control, the IF signal to be amplified and the control signal for the temperature variation compensation are fed to a common input (terminal) of the controllable stage.

BRIEF DESCRIPTION OF THE DRAWINGS

The invention will now be described in greater detail, by way of examples, with reference to the drawings, in which.

DESCRIPTION OF THE PREFERRED EMBODIMENTS

Figure 1:
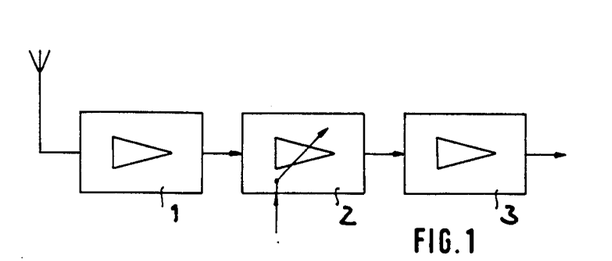
FIG. 1 is a block circuit diagram which shows a multi-stage signal transmitting system including an amplifier stage according to one embodiment of the invention.

FIG. 1 shows a multi-stage signal transmitting system according to the invention consisting of a receiver input circuit 1, the first IF stage 2 and the IF amplifier 3. The receiver input circuit is known to consist of the preselector stage and mixer stage. The IF amplifier 3 generally consists of several amplifier stages as well as the detector. The controlled stage in the embodiment of FIG. 1 is the first IF stage 2.

Figure 2:
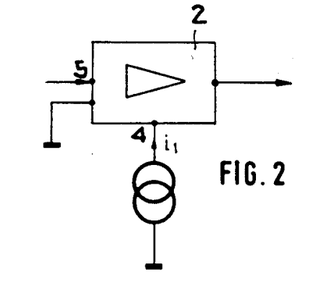
FIG. 2 is a circuit schematic which shows the actuation of the controlled stage of FIG. 1 by a current source.

FIG. 2 shows the actuation of the controlled stage 2, where the control is effected by a current $i_1$. The current $i_1$ contains the current fractions for amplification control and temperature variation compensation of the entire system.

Figure 3:
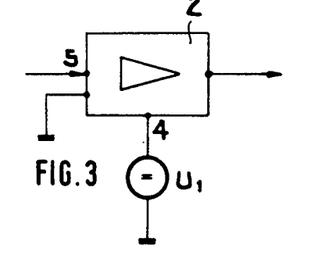
FIG. 3 is a circuit schematic which shows the actuation of the controlled stage of FIG. 1 by a voltage source.

Contrary to FIG. 2, in the embodiment of FIG. 3, the control is effected by a voltage source $u_1$, rather than by a current source as in FIG. 2.

Figure 4:
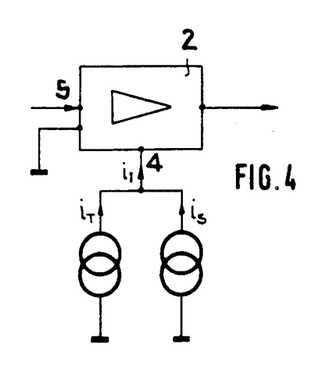
FIG. 4 is a circuit schematic which shows the current source of FIG. 2 as including two current sources producing two current fractions.
Figure 5:
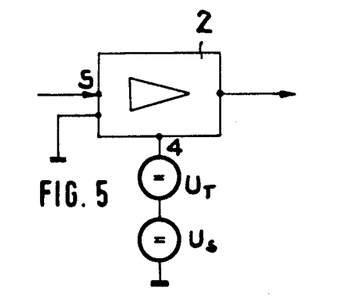
FIG. 5 is a circuit schematic which shows the voltage source of FIG. 3 as including two voltage sources producing two voltage fractions.

FIG. 4 shows the division of the current fractions, with $i_T$ representing the current fraction for the temperature variation compensation, and $i_S$ the current fraction for the amplification control. FIG. 5 shows in a corresponding manner the division of the control voltage fractions $u_T$, $u_S$. In FIGS. 2 to 5 the control input 4 and the signal input 5 are separate.

Figure 6:
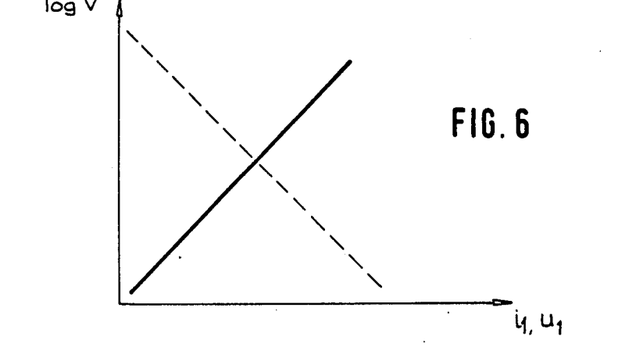
FIG. 6 is a diagram which shows the control characteristic formed by the logarithm of the amplified output signal versus the control signal.

FIG. 6 shows the control characteristic, i.e., the dependency of the amplification V on the control dimensions $i_1$ and $u_1$, respectively, in a semi-logarithmic display. The dependency in this type of display is linear. The broken line indicates that a reverse course is also realizable.

Figure 7:
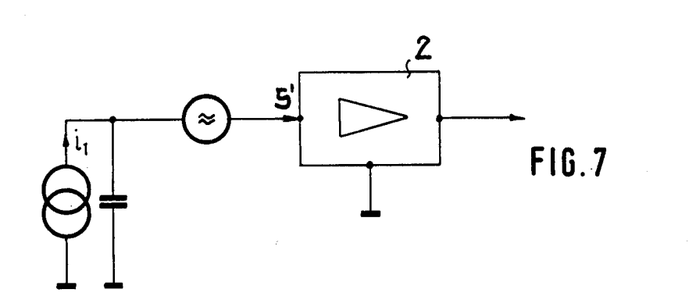
FIG. 7 is a circuit schematic which shows an amplifier stage according to another embodiment of the invention wherein a common input is provided for the signal to be amplified and the control signal.

FIG. 7 shows an embodiment of the invention wherein a common input 5' exists for both the input signal to be amplified and for the control signal $i_1$. The other inputs 4, 5 are omitted in this embodiment, which saves input terminals. This is of particular importance if the circuits according to the invention are integrated.

Figure 8:
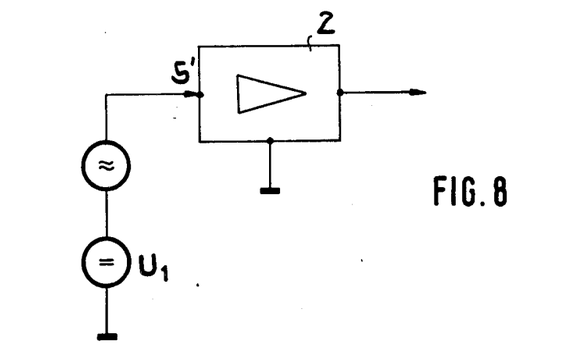
FIG. 8 is a circuit schematic similar to FIG. 7 but with voltage control in place of current control.

FIG. 8 shows a corresponding display for voltage control.

Figure 9:
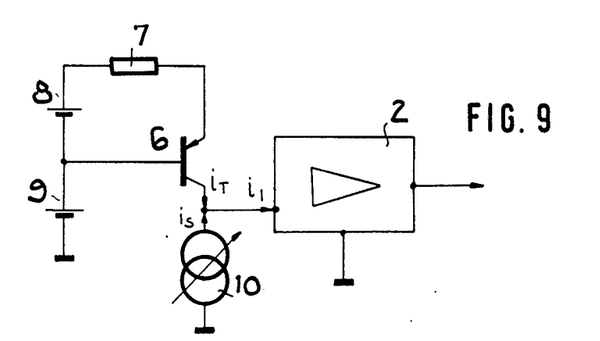
FIG. 9 is a circuit schematic which shows one detailed implementation of FIG. 7 wherein the two current fractions are generated.

FIG. 9 shows an example of how the two current fractions $i_T$, $i_S$ are generated. To produce the temperature-dependent control dimensions $i_T$, a transistor circuit consisting of a transistor 6 and a resistor 7 as well as the voltage sources 8 and 9 is provided. The function of this part of the circuit is based on the fact that the current $i_T$ generated by the transistor 6 is temperature-dependent, with the degree of temperature-dependency being dependent on the dimension of the resistance 7 and of the voltage of the voltage source 8. Here, it is advantageous for the function of the temperature variation compensation for the transistor 6 not to be monolithically integrated with one of the component groups of the transmitting system.

The control current $i_S$ for controlling the amplification is symbolized by the current source 10.

Figure 10:
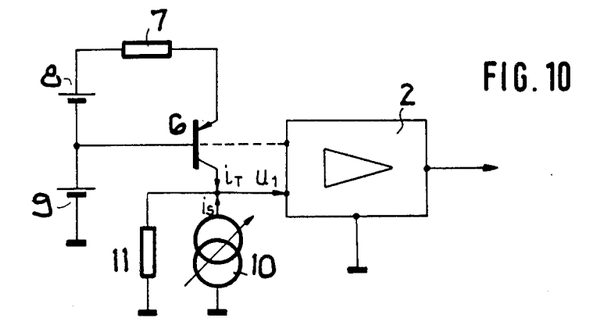
FIG. 10 is a circuit schematic similar to FIG. 9 which shows the use of a resistor which converts the current control into a voltage control.

The circuit of FIG. 10 differs from the circuit of FIG. 9 by the fact that there is a further resistor 11 which converts the current control into a voltage control. In FIG. 10, the dotted line indicates that the voltage source 9 may be integrated into the component containing the amplifier stage 2.

Figure 11:
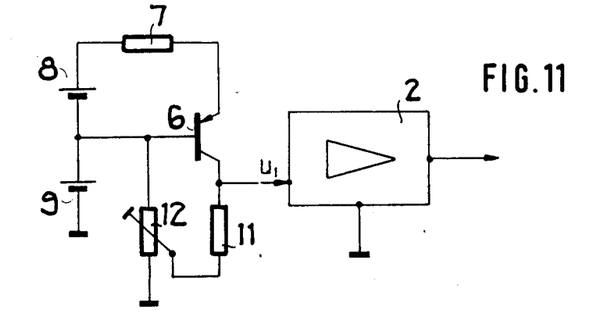
FIG. 11 is a circuit schematic similar to FIG. 10 wherein the control voltage for amplification is derived from a potentiometer.

The circuit of FIG. 11 shows another processing of the control dimensions required for the temperature variation compensation and for the amplification control. The generation of the temperature-dependent control signal $u_T$ is effected in the embodiment of FIG. 11 by the transistor circuit described in connection with FIG. 10. The control voltage for the amplification control is derived from the potentiometer 12.

Figure 12:
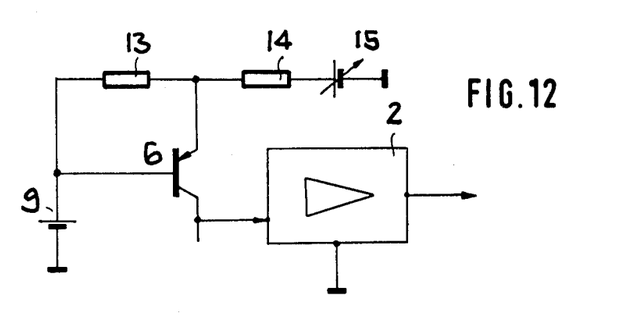
FIG. 12 is a circuit schematic which shows another embodiment for the generation of the current fractions.

FIG. 12 shows the generation of the control current fractions by means of a transistor circuit, with the control current for modifying the amplification being generated by this very same circuit. This may be done, for example, by changing the voltage of the voltage source 15.

Figure 13:
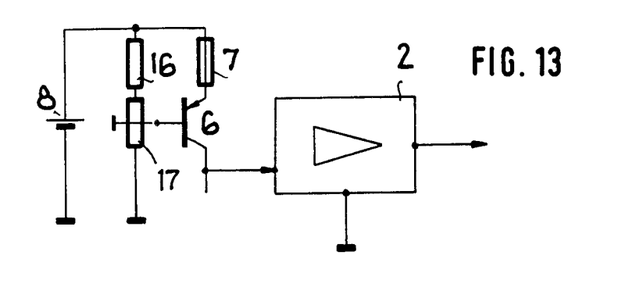
FIG. 13 is a circuit schematic which shows the setting of the control current by means of a potentiometer according to a further aspect of the invention.

In the embodiment shown in FIG. 13, the adjustment of the control current for the amplification is effected by controlling the base potential of the transistor 6 by means of a potentiometer 17.

Figure 14:
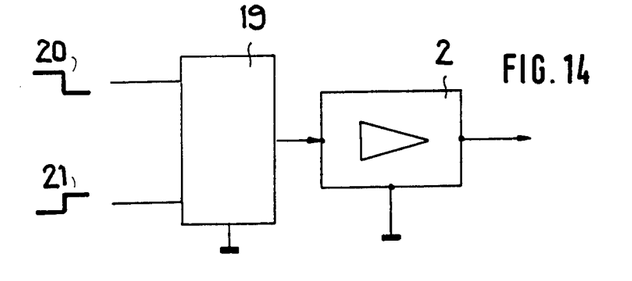
FIG. 14 is a block diagram which shows the setting of the amplification by means of digital control signals according to another aspect of the invention.

FIG. 14 shows that the amplification setting may be effected by means of digital control signals 20, 21. The control circuit 19 is required for this purpose.

Figure 15:
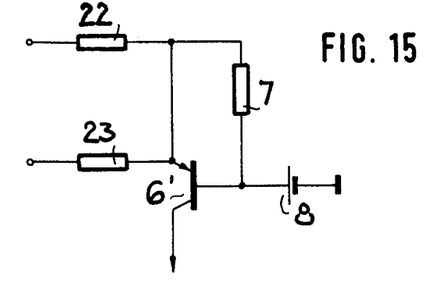
FIG. 15 is a circuit schematic which shows a control circuit with a transistor, a resistor and preliminary resistors according to another aspect of the invention.

The control circuit 19 of FIG. 14 consists, in compliance with FIG. 15, for example, of the transistor 6', the resistor 7 and the preliminary resistors 22 and 23. Several inputs may be provided (and thus also several resistors) to get finer amplification adjustment. The type of amplification setting enables, for example, automatic amplification adjustment via a microprocessor-controlled system.

Figure 16:
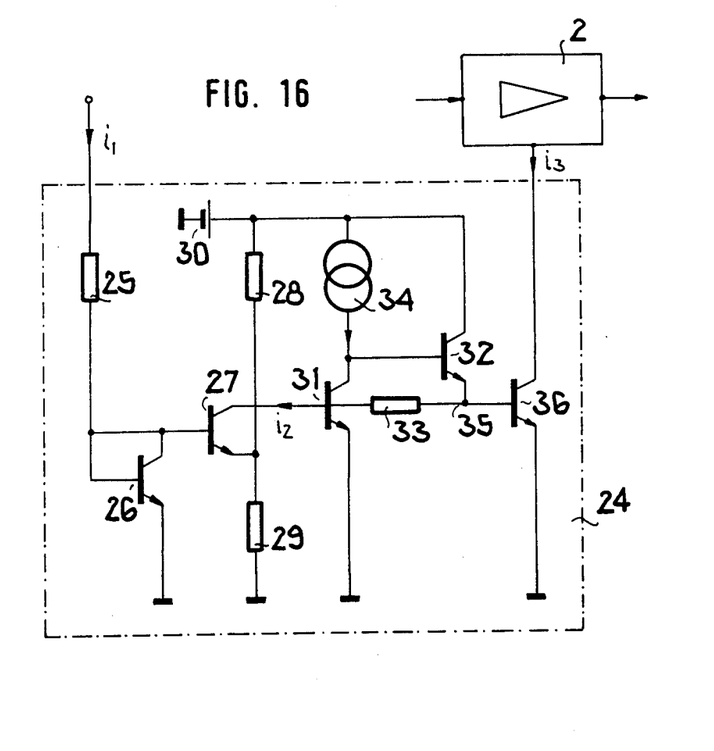
FIG. 16 is a circuit schematic which shows an amplifier stage in conjunction with a processing circuit according to a further aspect of the invention.

FIG. 16 shows a circuit containing the amplifier stage 2 in conjunction with the processing circuit for the current $i_3$ which controls the amplifier stage. In this circuit, the control signal $i_1$ is fed to the base-emitter section of a transistor 26 via a resistor 25. The collector of the transistor 26 is connected to both its base and the base of the transistor 27. The emitter of the transistor 27 is connected to a voltage divider which consists of the resistors 28 and 29 and is supplied by the voltage source 30. The collector of the transistor 27 controls an inverter amplifier consisting of the transistor 31, the transistor 32, the resistor 33 and the current source 34. The output 35 of the inverter amplifier is connected to the base of the transistor 36. The collector of the transistor 36 controls the amplifier stage 2 with its output current $i_3$.

In the circuit section comprising the transistors 26 and 27 there is generated a temperature variation of the current relationship $i_2/i_3$ which renders the slope of the characteristic of FIG. 6 temperature-independent. This is realized by an appropriate difference in voltage of the emitter potentials of the transistors 26 and 27 (by means of the voltage dividers 28 and 29), with it being advantageous to keep the absolute dimensions of the resistors 28 and 29 small enough for the emitter potential of the transistor 27 to be as independent as possible of the control current $i_1$. The exponential dependency of the amplification change on the input signal $i_1$ is caused by the fact that the collector current $i_2$ of the transistor 27 flows via the resistor 33, changing at the output of the inverter amplifier in accordance with the voltage drop at the resistor 33. The exponential dependency of the output current $i_3$ on the input current $i_1$ results from the exponential characteristic curve law of transistors.

Figure 17:
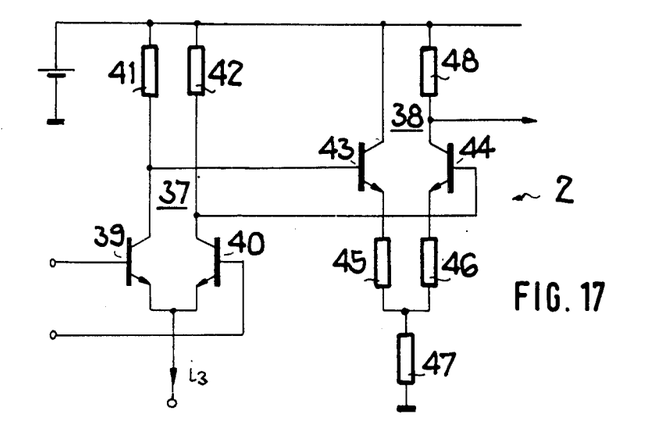
FIG. 17 is a circuit schematic which shows an embodiment for the amplifier stage which can be used to implement the invention.

FIG. 17 shows an embodiment for the amplifier stage 2. According to FIG. 17, the amplifier stage 2 consists of the differential amplifiers 37 and 38. The differential amplifier 37 consists of the transistors 39 and 40 as well as the resistors 41 and 42. The differential amplifier 38 consists of the transistors 43 and 44 as well as the resistors 45, 46, 47 and 48. While the differential amplifier 37 does not have a countercoupling, the differential amplifier 38 features a countercoupling (resistors 45 and 46). The control current $i_3$ is fed to the first differential amplifier 37 which is not countercoupled and thus modifies the amplification proportionally with the control current. The countercoupling of the differential amplifier 38 is of such size that no signal limitation is effected in this stage throughout the entire amplification adjustment range, but rather signal limitation is effected in the differential amplifier 37. This has the advantage that the limitation operation of the amplifier with respect to the input terminals is substantially independent of the amplification setting. A further advantage of the circuit according to FIG. 17 consists of the fact that the noise current components of the control current $i_3$ are suppressed as common-mode interference from the differential amplifier 38 with respect to the output signal of the amplifier 2.

Figure 18:
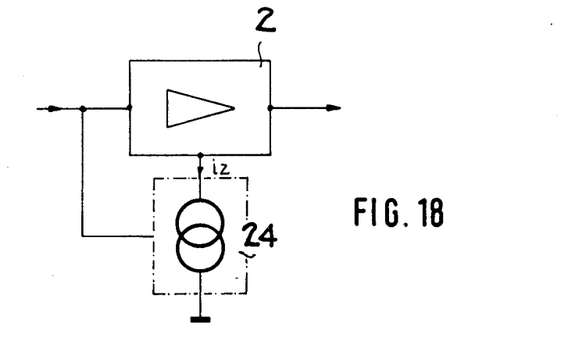
FIG. 18 is a circuit schematic which shows the linking of the amplifier input circuit with the control circuit according to a further aspect of the invention.

FIG. 18 symbolizes the linking of the amplifier input circuit for the amplifier input signal with the control circuit 24.

Figure 19:
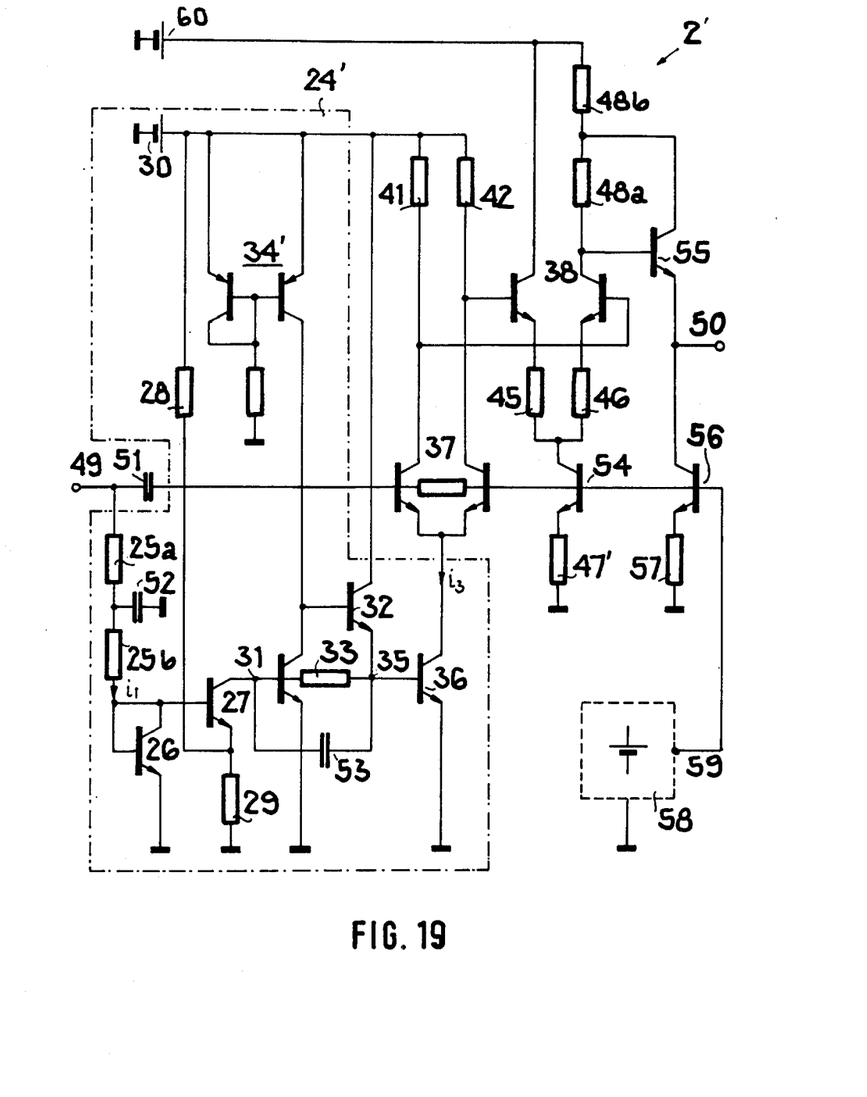
FIG. 19 is a circuit schematic which shows a combination consisting of an amplifier circuit and a control circuit according to the principle illustrated in FIG. 18.

FIG. 19 shows an embodiment of the combination of amplifier circuit and control circuit according to the principle illustrated in FIG. 18 with a common input for the signal to be amplified and for the signal controlling the amplification. Both types of signals are fed to the input terminal 49. The amplifier circuit and the control circuit 24' are decoupled from each other with respect to direct-current by means of a capacitor 51. The input signal controlled in amplification can be picked up at the output terminal 50. The control circuit 24' corresponds to the partial circuit 24 as shown in FIG. 16. In contrast to the circuit 24 shown in FIG. 16, the preliminary resistor 25 in the control circuit 24' according to FIG. 19 is split up into two parts 25a and 25b, with the connecting point between both resistors being blocked off by a capacitor 52 from reference potential. Furthermore, a capacitor 53 is connected in parallel to the resistor 33. Both capacitors are dimensioned such that they suppress any interference signals in the operating frequency range which would otherwise reach the amplifier to be controlled via the control circuit 24'. Such interference signals may be both components of the input signal and noise signal components. The control circuit 24' furthermore shows in comparison with the circuit section 24 according to FIG. 16, the practical embodiment of the current source 24 (FIG. 16) which is replaced by a current mirror circuit 34' in FIG. 19.

The circuit section 2' of FIG. 19 which is not enclosed by a broken line corresponds to the type of amplifier circuit presented in FIG. 17 consisting of the differential amplifier stages 37 and 38.

This amplifier circuit does, however, contain the following changes or additions compared to the amplifier circuit of FIG. 17: The external resistor 48 of the differential amplifier circuit 38 according to FIG. 17 is split up into the resistors 48a and 48b in the circuit according to FIG. 19. The sum of the resistance values of the resistors 48a and 48b determines the degree of amplification of the differential amplifier 38, and the dimension of the resistance 48b determines the output impedance of the amplifier circuit. The resistor 47 according to FIG. 17 is replaced in the circuit according to FIG. 19 by a current source consisting of the transistor 54 and the resistor 47'. The remainder of the amplifier circuit according to FIG. 19 in comparison to the one according to FIG. 17 consists of the output amplifier stage with the transistor 55 in conjunction with the current source circuit with the transistor 56 and the resistor 57.

Figure 20A:
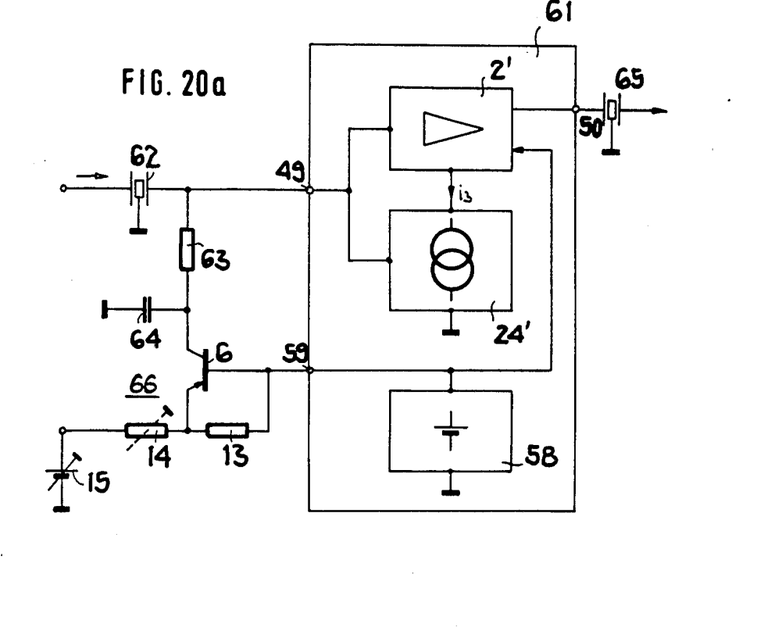
FIG. 20a is a circuit schematic which shows the circuitry of a controllable IF amplifier stage according to yet another aspect of the invention.

The voltage source 58 provides a constant potential for the bases of the transistor 54 and 56 as well as for the bases of the transistors of the differential amplifier 37. The size of the resistance 48b is dimensioned such that the differential internal resistance on the output side of the circuit has a preselected value (for example, 330 ohms). This is advantageous if, for example, ceramic filters requiring a certain terminating impedance on the input side should be connected to the output of an amplifier. The potentials of the voltage sources 58, 30 and 60 are dimensioned such that the voltage source 58 has the lowest and the voltage source 60 the highest potential at the respective positive pole of the voltage source. Amplification is effected, in the circuit arrangement according to FIG. 19, by means of a control voltage fed to the terminal 49 or by a control current. The control effect of the control voltage and the control current, respectively, according to the circuit shown in FIG. 19 occurs in such a way that the amplification increases exponentially (as shown in FIG. 6) as the positive control signal increases. This corresponds to a "dB linear" control characteristic which is characterized by the fact that a change in the control signal by a certain amount always results in the corresponding, relative amplification change of equal size for the amplification change and for the temperature variation influence independently of the other respective control signal change. FIG. 20a shows the circuitry of a controllable IF amplifier stage 61 according to the invention with only one input 49 for the signal to be amplified and the signal controlling the amplification. The internal circuitry of the arrangement 61 corresponds to the circuit in accordance with FIG. 19. The signal to be amplified is fed to the terminal 49 of the circuit 61 via a ceramic filter 62, and the signal controlling the amplification via the filter end resistor 63. The capacitor 64 is a blocking capacitor for the signal frequency. The signal whose amplification is controlled is picked up at the output terminal 50 and passed on to a following circuit (for example, IF amplifier) via the ceramic filter 65. The type of circuit 66 for the control signal processing, including the transistor 6, the resistors 13 and 14, and the voltage source 15, corresponds to the one of FIG. 12. With this circuit section 66 both the amplification setting and the temperature dependency for compensation of the temperature variation of the signal transmitting system are effected.

Figure 20B:
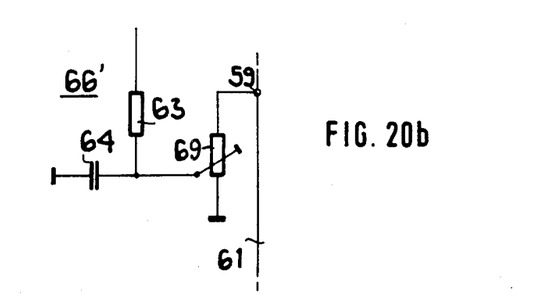
FIG. 20b is a circuit schematic which shows another embodiment of the control circuit according to the invention.

FIG. 20b shows an embodiment of the control circuit 66 wherein there is no provision for a transistor for the temperature variation compensation, and wherein the stabilized voltage of the voltage source 58 in conjunction with a potentiometer 69 is used for controlling the amplification. This circuit itself effects a temperature variation of the amplification in conjunction with the control circuit 24' according to FIG. 19. This temperature variation is caused by the fact that the base-emitter voltage of the transistor 26 in FIG. 19 varies with the temperature, and the current $i_1$ in conjunction with the value of resistances 25a and 25b varies correspondingly with constant control voltage applied at the terminal 49. This effect does not occur if—as in the circuit according to FIG. 20a—the terminal 49 is current-controlled.

What is claimed is:

1. In a multi-stage signal transmitting system including an amplifier stage whose amplification is electronically adjustable, said amplifier stage having control input means for receiving a control signal for electronically adjusting the amplification of the amplifier stage, and wherein undesired temperature influence on amplification is compensated, the improvement comprising: means connected to said control input means for producing a control signal, which includes an amplification component, for setting the amplification of said amplifier stage and further including temperature compensation means connected to said control input means for effecting temperature variation compensation via said amplifier stage independently of the setting of the amplification of said amplifier stage.

2. A signal transmitting system according to claim 1, wherein the amplification of said amplifier stage is exponentially dependent on the control signal which is fed to to said control input means.

3. A signal transmitting system according to claim 1, wherein the logarithm of amplification versus the control signal presents a control characteristic having a slope which is independent of temperature.

4. A signal transmitting system according to claim 1, wherein said temperature compensation means produces a temperature-dependent signal which constitutes a temperature dependent component of the control signal, and the temperature dependent component is fed, along with the amplification component, to said amplifier stage.

5. A signal transmitting system according to claim 4, wherein the control input means of said amplifier stage comprises a common input and the temperature-dependent component and the amplification component are fed to said common input.

6. A signal transmitting system according to claim 1, wherein said temperature compensation means comprises a control circuit including a transistor which has a temperature dependent base-emitter voltage, the control signal for the setting of the amplification of said amplifier stage is independent of temperature, and said control circuit produces a temperature-dependent component of the control signal in the form of a control current whose temperature dependency is effected by the temperature dependency of the base-emitter voltage of the transistor in said control circuit.

7. A signal transmitting system according to claim 1, wherein said control input means comprises a common input and wherein a signal to be amplified and said control signal are fed to said common input.

8. A signal transmitting system according to claim 1, further comprising a current supply circuit for supplying current to said amplifier stage, wherein said amplifier stage said temperature compensation means and said current supply circuit are integrated on a common semiconductor body.

9. A signal transmitting system according to claim 8, wherein said amplification component is in the form of a control voltage and further comprising voltage source means integrated on said common semiconductor body and coupled to said control voltage for processing said control voltage.

* * * * *